United States Patent
Lu et al.

(10) Patent No.: US 7,675,177 B1
(45) Date of Patent: Mar. 9, 2010

(54) FORMING COPPER INTERCONNECTS WITH SN COATINGS

(75) Inventors: Hongqiang Lu, Lake Oswego, OR (US); Byung-Sung Kwak, Portland, CA (US); Wilbur G. Catabay, Saratoga, CA (US)

(73) Assignee: LSI Corporation, Milpitas, CA (US)

( * ) Notice: Subject to any disclaimer, the term of this patent is extended or adjusted under 35 U.S.C. 154(b) by 30 days.

(21) Appl. No.: 11/074,456

(22) Filed: Mar. 7, 2005

Related U.S. Application Data

(62) Division of application No. 10/648,602, filed on Aug. 25, 2003, now Pat. No. 6,884,720.

(51) Int. Cl.
*H01L 23/48* (2006.01)
*H01L 23/52* (2006.01)
*H01L 29/40* (2006.01)

(52) U.S. Cl. .................. 257/774; 257/E21.575; 257/E21.627; 257/E21.641

(58) Field of Classification Search ........... 438/634, 438/643, 210, 631, 687; 273/274; 420/559; 257/40, 377, 774, E23.141–E23.145, E21.579, 257/E21.575, E21.627, E21.641
See application file for complete search history.

(56) References Cited

U.S. PATENT DOCUMENTS

| | | | | |
|---|---|---|---|---|
| 5,182,624 A | * | 1/1993 | Tran et al. ................ 257/40 |
| 5,391,517 A | * | 2/1995 | Gelatos et al. ............. 438/643 |
| 5,871,690 A | * | 2/1999 | Achari et al. .............. 420/559 |
| 6,001,730 A | * | 12/1999 | Farkas et al. .............. 438/627 |
| 6,022,808 A | | 2/2000 | Nogami et al. |
| 6,133,144 A | * | 10/2000 | Tsai et al. ................. 438/634 |
| 6,198,170 B1 | * | 3/2001 | Zhao ....................... 257/784 |
| 6,316,356 B1 | | 11/2001 | Farrar et al. |
| 6,329,234 B1 | * | 12/2001 | Ma et al. ................... 438/210 |
| 6,464,225 B1 | * | 10/2002 | Webb ....................... 273/274 |
| 6,774,035 B2 | | 8/2004 | Farrar et al. |
| 6,828,613 B2 | | 12/2004 | Dubin et al. |
| 6,875,692 B1 | * | 4/2005 | Chang et al. .............. 438/687 |
| 2004/0253809 A1 | * | 12/2004 | Yao et al. .................. 438/631 |

\* cited by examiner

*Primary Examiner*—Leonardo Andújar
*Assistant Examiner*—Monica D Harrison
(74) *Attorney, Agent, or Firm*—Bever Law Group LLP

(57) ABSTRACT

A copper interconnect with a Sn coating is formed in a damascene structure by forming a trench in a dielectric layer. The trench is formed by electroplating copper simultaneously with a metal dopant to form a doped copper layer. The top level of the doped copper layer is reduced to form a planarized surface level with the surface of the first dielectric layer. The doped copper is annealed to drive the metal dopants to form a metal dopant capping coating at the planarized top surface of the doped copper layer.

17 Claims, 5 Drawing Sheets

| Material | Atomic Volume (cm$^3$/mol) | Surface Free Energy (mJ/m$^2$) |
|---|---|---|
| Pb | 18.27 | 620 |
| In | 15.73 | 674 |
| Sn | 16.31 | 685 |
| Cu | 7.11 | 1830 |
| Ta | 10.90 | 2480 |

FIG. 4

FORMING COPPER INTERCONNECTS WITH SN COATINGS

RELATED APPLICATIONS

This is a Divisional application of prior U.S. application Ser. No. 10/648,602, entitled "FORMING COPPER INTERCONNECTS WITH SN COATINGS", filed on Aug. 25, 2003 now U.S. Pat. No. 6,884,720, which is incorporated herein by reference and from which priority under 35 U.S.C. §120 is claimed.

BACKGROUND OF THE INVENTION

1. Field of the Invention

The present invention relates to interconnects and methods for forming them on semiconductor wafers. More particularly, the present invention relates to methods for reducing electromigration in interconnects.

2. Description of the Related Art

As integrated circuit devices grow smaller and smaller, higher conductance and lower capacitance is required of the interconnects. In order to accommodate these objectives, the trend has been towards the use of copper for interconnects and damascene methods for forming the interconnects. One drawback to the use of copper in the interconnects and metallization conductors is its tendency to diffuse (i.e., leakage) into adjacent dielectric layers. Copper diffuses easily into dielectric layers and diminishes the electrical insulation qualities of the dielectric.

To address these problems, copper barrier layers, for example layers containing tantalum, have been deposited before the deposition of copper to prevent "leakage". This barrier layer must be able to prevent diffusion, exhibit low film resistivity, have good adhesion to dielectric and Cu and must also be CMP compatible. Also the layer must be conformal and continuous to fully encapsulate Cu lines with as thin a layer as possible. Due to higher resistivity of barrier material, the thickness should be minimized for Cu to occupy the maximum cross-sectional area. Failures due to electromigration are also major reliability concern affecting the back-end interconnect reliability. Electromigration is the current induced diffusion of atoms due to the momentum transfer from moving electrons. Electromigration may result in voiding and thus open circuit failures.

Since copper has a much lower diffusivity through the grain boundary than aluminum, copper was felt to be intrinsically more reliable than aluminum by many orders of magnitude. This belief was one major motivation to migrate from aluminum based interconnects to copper based ones. In practice, however, copper/oxide based interconnects exhibit similar or only slightly better electromigration lifetimes compared to aluminum based interconnects.

This disparity between theoretical projections and observed characteristics has resulted from the misplaced notion that grain boundary diffusion is the dominant electromigration failure mechanism for both aluminum and copper wires. While this assumption may hold true for aluminum, it is not the case for copper.

Cu differs from Al in many ways. Since Copper is not well suited to subtractive formation processes such as dry-etch methods for the patterning of the lines, Cu is typically patterned by additive processes such as the Cu damascene process. In one such method, three sides of copper wire are wrapped in a refractory metal such as Ta, TaN, or combination thereof, to prevent diffusion of the copper into the oxide film. The fourth or top surface is covered by a dielectric film, such as SiN or SiC. The relatively weak bonding at the Cu and the dielectric layer interface in turn results in a strong propensity for interface diffusion during electromigration. It is believed that this diffusion path becomes the dominant factor in electromigration in almost all cases. That is, the electromigration lifetime is limited by the poor interface performance even with very high bulk copper properties.

Many methods have been proposed to solve these problems but typically the solutions offered create additional problems. For example, one proposed method involves the selective electroless deposition of metal such as CoWP on top of the Cu wire after copper chemical mechanical planarization (CMP). Although the electromigration lifetimes are improved, the method is very sensitive to the incoming wafer surface condition and the surface clean process. Furthermore, selective deposition may not be possible and may cause leakage and shorts between wires. This becomes worse as spacing between the wires becomes tighter. Extra process steps are required in performing the electroless deposition of metal on top of the copper wire as well as extra steps in cleaning the backside and bevel of the wafer. Moreover, the higher resistively of the capping metal may broaden the distribution of via resistance.

Accordingly, improved methods for forming thin metals on top of copper wires are needed. These methods should allow formation of the thin metal without adding extra process steps.

SUMMARY OF THE INVENTION

To achieve the foregoing, the present invention provides methods for forming copper interconnects by electroplating bulk copper simultaneously with metal dopants having lower surface energy. The processing sequence involves an initial formation of a dual-damascene pattern in the dielectric film stack. Copper barrier films and copper seed layers are then deposited in sequence by physical vapor deposition or other methods. Then copper electroplating is performed with metal dopants added into the chemistry. The metal dopants are incorporated into the copper films in the dual-damascene structure. Following planarization, an anneal is performed for a selected time and temperature sufficient to drive the metal dopants to the top of the copper surface.

By processing the semiconductor wafer in this manner, the baseline process flow for forming copper interconnects is changed only in the electroplating step. Since the dominant failure mechanism in copper dual-damascene structures is the interfacial diffusion between the copper and the dielectric film, reliability will increase due to the suppression of the diffusion. Moreover, with these techniques, a copper damascene structure may be formed having a very high resistivity to electromigration.

According to one embodiment, a method of forming an interconnect conductor on a semiconductor is provided. A trench is formed within a first dielectric layer on the semiconductor wafer. The trench is filled by electroplating copper simultaneously with a metal dopant to form a doped copper layer. The top level of the doped copper layer is reduced to form a planarized surface level with the surface of the first dielectric layer. The doped copper layer is then annealed under annealing conditions sufficient to drive the metal dopants to the surface region of the doped copper, i.e., the planarized top surface of the doped copper layer, to form a metal dopant capping layer.

These and other features and advantages of the present invention are described below with reference to the drawings.

BRIEF DESCRIPTION OF THE DRAWINGS

FIG. 4 is a table illustrating surface energies of different metal layers.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In accordance with embodiments of the present invention, the simultaneous electroplating of metal dopants with lower surface energy during the copper electroplating process, coupled with a post-annealing process, enables the formation of a thin metal cap layer between the copper and the dielectric layer while minimizing the dopants in the core of the metal interconnect line. With this method, the resistivity of the "binary" interconnect line is reduced. Moreover, the improved bonding strength at the metal-to-metal interface reduces the diffusion of copper atoms at this interface and results in substantially improved electromigration lifetimes.

The processing sequence involves an initial formation of a dual-damascene pattern in the dielectric film stack. Copper barrier films and copper seed layers are then deposited in sequence by physical vapor deposition or other methods. Then copper electroplating is performed with metal dopants added into the chemistry. The metal dopants are incorporated into the copper films in the dual-damascene structure. Following planarization, an anneal is performed for a selected time and temperature sufficient to drive the metal dopants to the top of the copper surface.

By processing the semiconductor wafer in this manner, the baseline process flow for forming copper interconnects is changed only in the electroplating step. Since the dominant failure mechanism in copper dual-damascene structures is the interfacial diffusion between the copper and the dielectric film, reliability will increase due to the suppression of the diffusion. Moreover, with these techniques, a copper damascene structure may be formed having a very high resistivity to electromigration.

Figure 1:
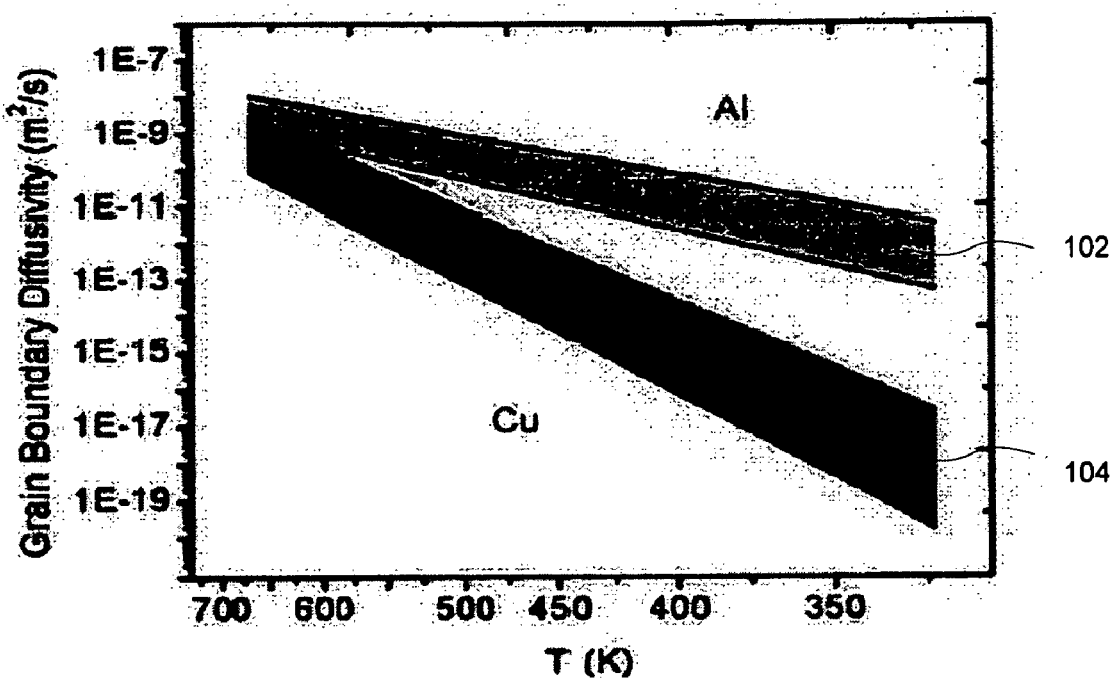
FIG. 1 is a diagram illustrating grain boundary diffusivity of various metals.

The motivation for recognizing and addressing alternative electromigration failure mechanisms can be understood by examining the respective diffusivities of Cu and Al. FIG. 1 is a diagram illustrating grain boundary diffusivity of copper and aluminum. This diagram illustrates that the grain boundary diffusivity of copper 104 is many magnitudes less than aluminum 102. That is, if electromigration principally occurred through the grain boundary, copper would be expected to be considerably more reliable than aluminum. In practice, the Cu/oxide based interconnect has similar or only slightly improved electromigration lifetimes in comparison to Al based interconnects.

To address the issue of the electromigration failure mechanism caused by poor interface performance, the present invention provides a thin capping coating which forms in the surface region beneath the CMP planarized surface of the damascene stack.

Figure 2A:
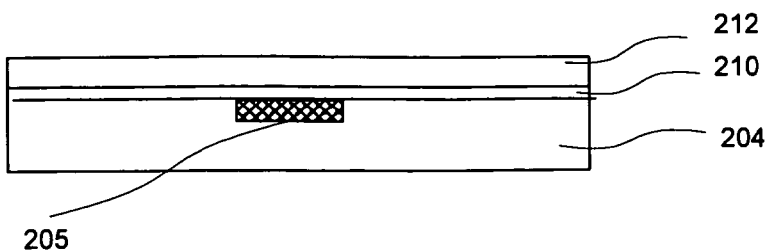
FIGS. 2A-2J are diagrams illustrating stages in the formation of a dual damascene structure in accordance with one embodiment of the present invention.

FIGS. 2A-2J are diagrams illustrating stages in the via-first dual damascene process of forming a semiconductor integrated circuit in accordance with one embodiment of the present invention. Embodiments of the present invention eliminate the need for additional processes to form a barrier layer or capping layer on top of the copper interconnects. The process begins, as shown in FIG. 2A, with a barrier layer 210 containing, for example, silicon nitride or silicon carbide, formed over the first metal layer 205, the latter formed in a dielectric 204. Dielectric 204, as illustrated, may be any interlayer dielectric. For example, the dielectric may be a pre-metal dielectric (PMD) or any intermetal dielectric (IMD). Still, conductors for receiving damascene interconnects and vias formed in the dielectric layer surrounding the gates of the transistors may comprise metals other than copper. That is, pre-metal dielectrics (PMD) such as phosphosilicate glass are deposited over transistors. Interconnects formed by the techniques of the present invention may be configures for connecting to all types of conductors in any of the interlayer dielectrics, i.e., the PMD or any of the IMD's.

Even when copper damascene methods are used for interconnect layers, the contacts and vias (e.g., plugs) formed in the PMD layer are often formed from tungsten or other non-copper metals. The techniques of the present invention eliminate the separate deposition of a barrier layer over the copper interconnects but in one embodiment, the damascene layers may be formed over dielectric layers and metal lines or vias including barrier layers such as barrier layer 210 as illustrated. The barrier layer 210 may be formed by plasma enhanced chemical vapor deposition ("PECVD") methods or other methods known to those of skill in the relevant art.

A dielectric layer 212, preferably a low-k dielectric layer, is then formed over the dielectric stack (204, 205, 210) as shown in FIG. 2A. The low-k dielectric layer 212 may be formed by various methods known to those of skill in the art, including a PECVD process, a spin-on process, and a flow-fill process. The low-k dielectric layer may be SiCOH or some other dielectric composition formed using silicon, carbon, oxygen and hydrogen, such as are known in the art. Low-k materials exhibit increased porosity in comparison to conventional silicon oxide dielectric layers. Such low-k dielectric materials may exhibit k values of 2.8 or lower (compared to conventional dielectrics (e.g. $SiO_2$) which exhibit k values of about 4.0 or more). For example, low-k organosilicate films have shown k values ranging from 2.6 to 2.8. Low-k dielectrics are well known in the art and are discussed, for example, in "Designing Porous Low-k Dielectrics," Semiconductor International (May 2001), incorporated by reference herein in its entity.

Figure 2B:
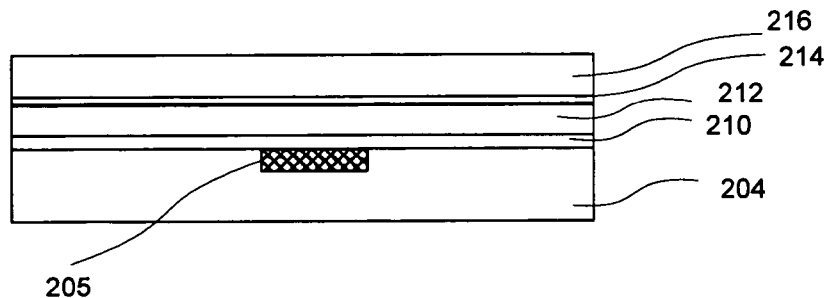

An etch stop layer 214 is then optionally deposited on top of the low-k dielectric layer 212 as shown in FIG. 2B. The etch stop layer 214 is selective to the low-k dielectric material. Nitrogen-free SiC materials are commonly used as etch stops. As also shown in FIG. 2B, a second low-k dielectric layer 216 is then deposited on top of the etch stop 214 to facilitate fabrication of the dual damascene structure. A capping layer 218 is then deposited over the second low-k layer 216, serving as an inorganic ARC (anti-reflective coating) layer to improve litho printing capability. This capping layer 218 will be then removed during Cu CMP process, and therefore has no impact on the final film stack. For example, SiON, or SiOC may be used for the capping layer.

Figure 2C:
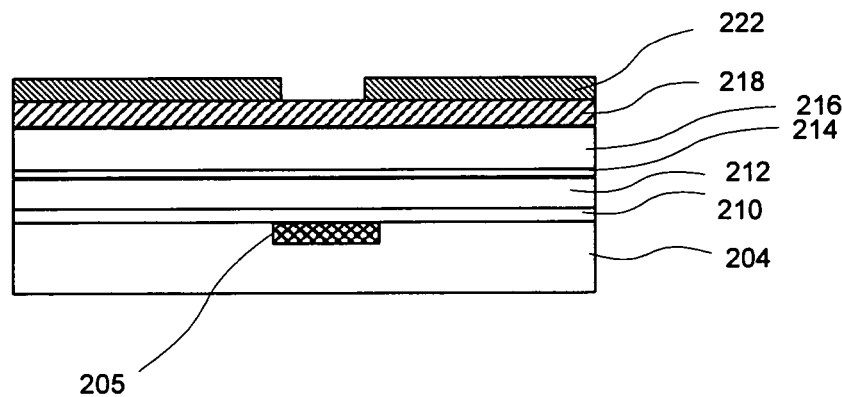

As shown in FIG. 2C, a photoresist layer is then deposited on the stack, and patterned to form a mask 222.

Figure 2D:
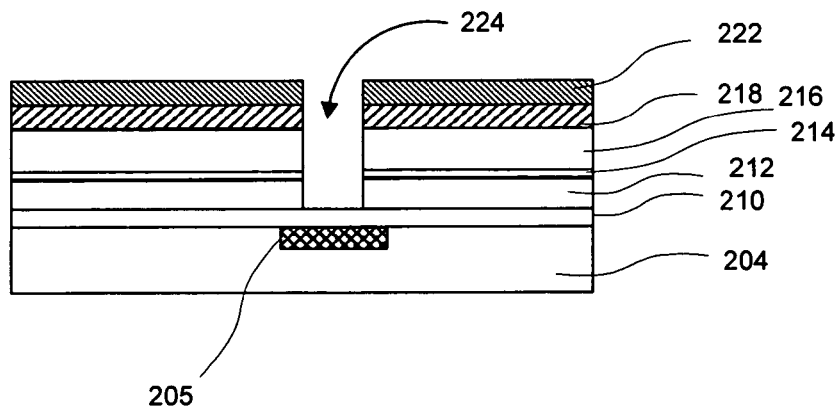

A via 224 is etched through capping layer 218, two low-k dielectric layers 212 and 216 as well as etch stop 214 (See FIG. 2D). This may be achieved through the use of an anisotropic etch such as a plasma dry etch. Following removal of the mask layers, the trench is formed.

Figure 2E:
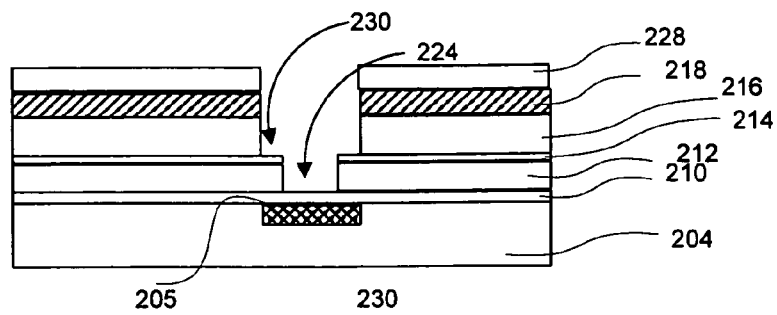
Figure 2F:
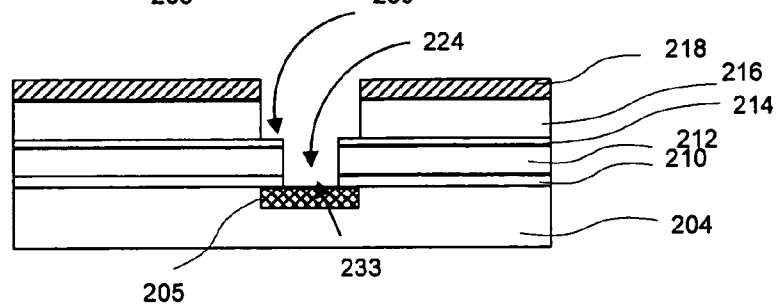

Continuing with the process of the present invention, after removal of the first photoresist layer, a second photoresist layer 228 is deposited, patterned and etched to form the trench 230 as shown in FIG. 2E. Etching stops on the etch stop layer 214 to form the trench and via structure shown in FIG. 2E. In subsequent steps, the photoresist mask 228 is removed as well as the barrier layer 210 (open barrier etch) adjacent to the metal layer 205. Etch gases for performing an open barrier etch are well known to those of skill in the relevant art and will not be described further here. These are typically low energy etches, for example, using gas mixtures containing $CF_4$ or similar. See FIG. 2F.

Figure 2G:
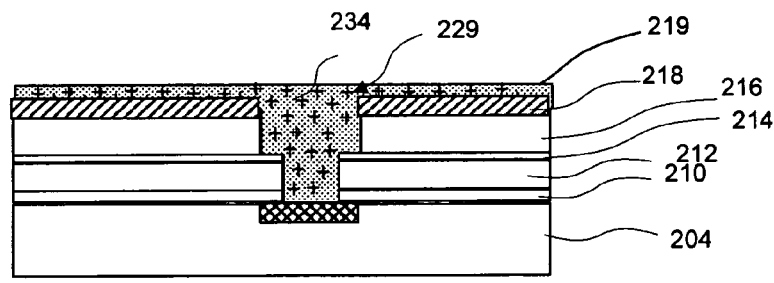

Next, as illustrated in FIG. 2G and according to standard processing techniques, the via and trench will typically then be filled first with a barrier metal layer 236 such as for example, tantalum, tantalum nitride, Pd, WN or TiN and then with a copper seed layer (not shown) either by PVD, iPVD, SIPVD, MOCVD, electroless, ALD or direct plating methods.

Next, the trench and via are filled by electroplating copper, as illustrated in FIG. 2G, to form copper interconnect 234. The copper electroplating is performed with metal dopants 229 added into the chemistry, thus permitting the incorporation of the dopants 229 into the Cu films of the dual damascene or other damascene structure. The typical Cu plating baths currently in use in the semiconductor industry, consist of $CuSO_4$ salts with $H_2SO_4$, $CuCl_2$, and various organic additives, running at various temperatures depending on the types of organic additive. It is anticipated that if an appropriate dopant "salt" is chosen for a given Cu-plating electrolyte bath, all other parameters (i.e., acidity, temperature, organic additive levels, inorganic levels, flow rates, rotation rates, plating recipes) can remain the same as that for the given pure Cu-bath. The dopant level in the film is modulated with the level in the electrolyte bath. Preferably, the metal dopants will comprise any metal having a surface energy less than that of Cu, i.e., less than about 1830 mJoule/$m^2$. Preferably, the metal dopants will have (1) very low miscibility with Cu and (2) low surface energy. In accordance with one embodiment, the dopants 229 will comprise one of Sn, and In.

Preferably, the metal dopants will comprise less than about 5% of the bulk copper layer, more preferably between 0.5 and 2%. That is, before any annealing of the bulk copper layer (with metal dopants incorporated), the dopants will be dispersed throughout the bulk copper to form a substantially homogenous layer, the metal dopants present in the concentration percentages discussed above. As described below, the post-CMP annealing process drives the metal dopants to the surface to form a separate thin capping layer As illustrated in the table of FIG. 4, Sn and In have very low surface energies relative to Cu. Since these dopants have very low surface energy, they can be easily driven to the Cu surface in a post-annealing step. An example of an alternative metal includes Pb. Pb, may be suitable in cases where the potential toxicity of the metal is adequately controlled.

An optional post Cu electroplating anneal process step may be performed at this point (not shown). If such a process step is incorporated, the process must be adequately controlled to prevent migration of the metal dopants completely to the area of the copper that will be removed in a subsequent CMP step. Prior to this point, the metal dopants will preferably form a substantially homogenous metal-doped copper structure. Annealing causes a migration of the metal dopants to the upper levels of the electroplated copper layer. Thus, sufficient control of the annealing temperatures and times are necessary to prevent migration of substantially all of the metal dopants to the ECP copper layer that will be reduced in the CMP step. Preferably, the annealing temperature will be controlled in this step to less than 100 C.

Figure 2H:
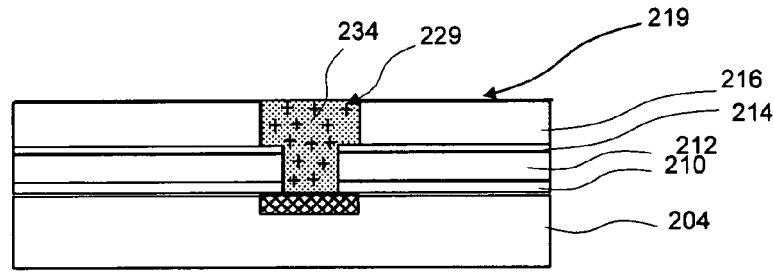

FIG. 2H illustrates the interconnect structure following chemical mechanical polishing (CMP). That is, the deposited bulk copper 234 and the capping layer 218 are polished to form a planarized surface 219. The removal of the capping layer 218 is effectuated by the polishing.

Figure 2I:
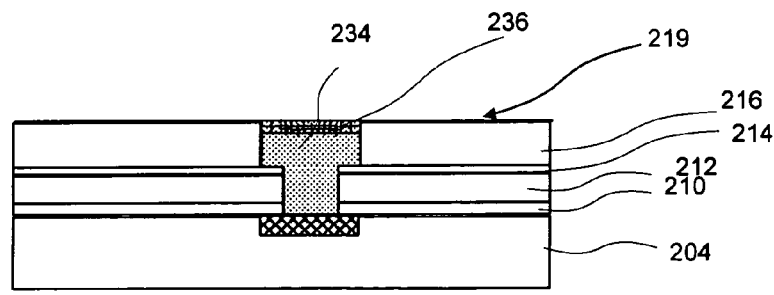

Next, as illustrated in FIG. 2I, a post-CMP anneal is performed at an optimized temperature and duration to drive the metal dopants 229 to the planarized top surface 219 of the copper. In accordance with one embodiment, the temperature lies in the range of 150 to 450 C for dopants for dopants used with LowK structures, preferably for a time in the range from about 5 to 180 min. More preferably, the temperature lies in the range form 250 to 350 C. As a result, a thin metal capping coating layer 236 is formed at the top of the bulk copper 234. Preferably, the capping coating will have a thickness in the range of about 5 to 100 Angstroms, extending from the planarized surface to the silicon substrate. More preferably, the capping coating will have a thickness in the range from about 10 to 30 Angstroms. Preferably, under suitable annealing conditions, the metal dopants will be driven substantially entirely to the surface of the copper layer and thereby forming a separate dopant layer. That is, preferably an interface will be formed between the copper interconnect 234 and the dopant coating 236. This metal-to-metal interface provides improved electromigration performance in comparison to the copper and SiN or SiC interface formed by conventional techniques.

Figure 2J:
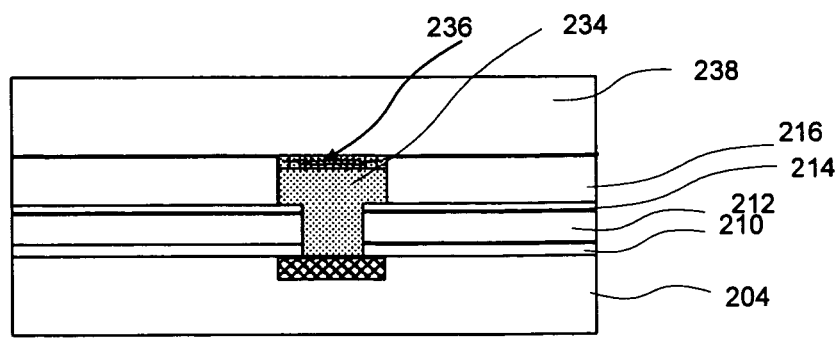

Next, as illustrated in FIG. 2J, a second level of dielectric film stack 238 is deposited, to permit the process to be repeated for each of the overlying interconnect layers.

The foregoing process, as specifically illustrated in FIGS. 2A-2J, describes the formation of a trench structure according to a "via first" process in accordance with one embodiment of the present invention and specifically describes one method of using the via-first approach. The via first sequence is but one of several dual damascene approaches to connect one layer of metal to the overlying or underlying metal layer or transistor contact. The embodiments of the present invention are applicable to any dual damascene technique, such as are well known in the art. A review of dual damascene processing techniques in provided in the article "Dual Damascene: Overcoming process issues," Semiconductor International (June, 2000), incorporated by reference herein in its entirety. For example, two alternative dual damascene processes are "trench first" and a self-aligned process ("buried via"). The steps of the process described above are provided as an example. Given the guidance provided by these steps, one skilled in the relevant art could apply the steps to the various configurations described throughout the specification to form the structures using various damascene and dual damascene processes and thus the scope of the invention is not intended to be limited to the process steps described.

Figure 3:
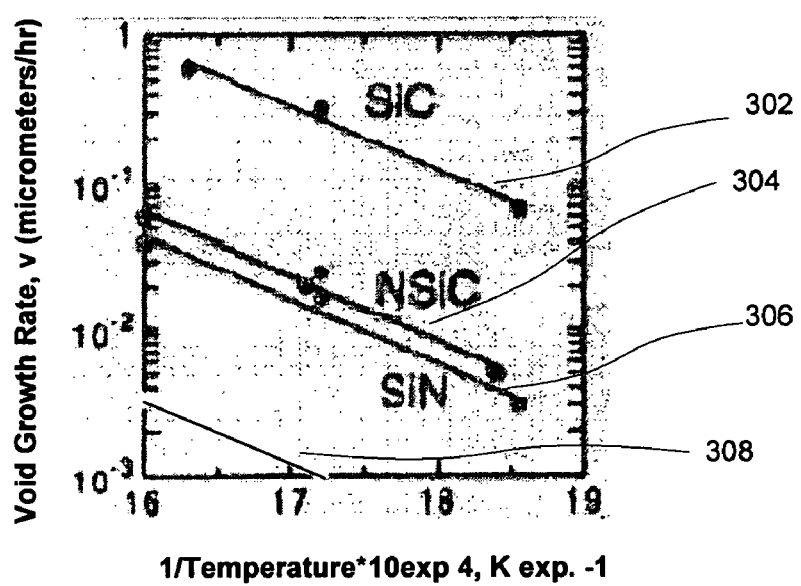
FIG. 3 is a graph illustrating void formation as a function of temperature for various cap materials.

The improved electromigration performance can be observed from examination of experimental data regarding temperature dependent void growth rates for different interfaces. FIG. 3 is a graph illustrating void formation as a function of temperature for various cap materials. In-situ void growth was measured using Scanning Electron Microscopy (SEM) techniques. As illustrated, the void growth rate in SIC (302), NSiC (304), and SiN (306) are all substantially greater than the proposed capping coatings, which is illustrated in FIG. 3 as reference number 308.

FIG. 4 is a table illustrating surface energies of different metal layers. As illustrated, Sn, In, and Pb offer surface free energies of less than 700 mJ/m$^2$. While the invention has been illustrated using preferably Sn or In, the invention is not so limited. The scope of the present invention is intended to extend to all metal dopants having sufficiently low surface energies and low miscibility with Cu to enable migration of the dopants to the surface of the electroplated copper under suitable annealing conditions. These additional metals include, for example and not to be limited thereby, Pb and In.

The techniques of the present invention provide the capability of producing Cu interconnects with improved electromigration reliability. Specifically, formation of the copper interconnects with the top plating layer of tin (Sn) or indium or other similar low surface energy materials suppresses interfacial diffusion between Cu and the dielectric barrier film, thus reducing the dominant failure mechanism in Cu-dual damascene structures.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A semiconductor interconnect structure, the interconnect structure comprising:
    a first dielectric having a planarized top surface and an inlaid electroplated bulk copper line formed therein, the inlaid copper line further including a top surface having a metal coating film formed thereon, wherein a top surface of the metal coating film is coplanar with the planarized top surface of the first dielectric and wherein the metal coating film is comprised substantially of a second metal material having a property of being suitable to enable migration of the second metal to the top surface of the bulk copper line by annealing.

2. The semiconductor interconnect structure of claim 1 wherein the second metal material forming the metal coating film has a surface energy of less than about 1830 mJoule/m$^2$ and low miscibility in copper.

3. The semiconductor interconnect structure of claim 2 wherein the second metal material of the metal coating film comprises Sn.

4. The semiconductor interconnect structure of claim 2 wherein the second metal material of the metal coating film comprises one of In and Pb.

5. The semiconductor interconnect structure of claim 2 wherein the metal coating film extends from the planarized surface to a depth of 5 to 100 Angstroms.

6. The semiconductor interconnect structure of claim 2 wherein the metal coating film extends from the planarized surface to a depth of 10 to 30 Angstroms.

7. A semiconductor interconnect structure as recited in claim 1 wherein second metal material of the metal coating film further has a property of providing an electromigration barrier layer to the underlying bulk copper.

8. A semiconductor interconnect structure as recited in claim 1 wherein the metal coating film comprises a layer of the second metal material such that there is substantially no second metal material in the bulk copper line that underlies the metal coating film.

9. A semiconductor interconnect structure as recited in claim 8 wherein second metal material of the metal coating film further has a property of forming an electromigration barrier to copper.

10. A semiconductor interconnect structure as recited in claim 1 wherein a barrier layer is formed at an interface between the first dielectric and the bulk conductor.

11. A semiconductor interconnect structure comprising:
    a first dielectric having an inlaid bulk copper-containing layer formed therein;
    a second dielectric layer formed on the first dielectric with an opening formed therein, the opening exposing the underlying copper containing layer;
    the opening is substantially filled with a second copper containing layer that is substantially free from a barrier material;
    an inlaid metal coating film is formed directly on top of the second copper containing layer and configured to prevent diffusion of copper from the second copper containing layer wherein the metal coating film is comprised of said barrier wherein the barrier material is a material that is not miscible in copper and has a surface energy of less than about 1830 mJ/m$^2$; and
    a planarized surface including a planarized top surface of the metal coating film that is coplanar with a planarized top surface of the second dielectric layer.

12. A semiconductor interconnect structure as in claim 11 wherein the inlaid second metal coating film comprises metal materials comprising Sn.

13. A semiconductor interconnect structure as in claim 11 wherein the inlaid second metal coating film comprises metal materials comprising In.

14. A semiconductor interconnect structure as in claim 11 wherein the inlaid second metal coating film comprises metal materials comprising Pb.

15. A semiconductor interconnect structure as in claim 11 wherein the barrier material of metal coating film is comprised of a material having a surface energy of less than about 700 mJ/m$^2$.

16. A semiconductor interconnect structure as in claim 11 wherein the barrier material of metal coating film bonds to the second copper containing layer in an interface structure between the metal coating film and the second copper containing layer; and
    wherein the barrier material has a property of enabling migration through the second copper containing layer to the top surface of the second copper containing layer during annealing to form the interface structure so that the there is that has a greater bonding strength between the metal coating film and the second copper containing layer than if the metal coating film were merely deposited on the second copper containing layer.

17. A semiconductor interconnect structure, the interconnect structure comprising:
    a first dielectric having a planarized top surface and having an opening formed therein;
    an inlaid bulk conductor is formed in the opening using a first metal material comprising copper that is substantially free of a second metal material; and a top surface of the inlaid bulk conductor having a metal coating film formed thereon, the metal coating film formed of the second metal material and having an upper surface that is coplanar with the planarized top surface of the first dielectric, the second metal material having a property of being suitable to enable migration of the second metal through the copper of the inlaid bulk conductor to the top surface of the bulk conductor during an anneal process to form an interface structure between the bulk conductor and the second material that is that has a greater bonding strength than if the second material were merely deposited on the bulk layer.

* * * * *